(12) United States Patent
Chen et al.

(10) Patent No.: US 10,280,339 B2
(45) Date of Patent: May 7, 2019

(54) METHOD FOR MANUFACTURING FLEXIBLE ELECTRICAL DEVICE

(71) Applicants: HannStar Display (Nanjing) Corporation, Nanjing (CN); HannStar Display Corporation, Taipei (TW)

(72) Inventors: Yen-Chung Chen, Taichung (TW); Chen-Hao Su, Taichung (TW)

(73) Assignees: HannStar Display (Nanjing) Corporation, Nanjing (CN); HannStar Display Corporation, Taipei (TW)

( * ) Notice: Subject to any disclaimer, the term of this patent is extended or adjusted under 35 U.S.C. 154(b) by 3 days.

(21) Appl. No.: 15/782,839

(22) Filed: Oct. 12, 2017

(65) Prior Publication Data

US 2018/0346761 A1 Dec. 6, 2018

(30) Foreign Application Priority Data

May 31, 2017 (CN) .......................... 2017 1 0400016

(51) Int. Cl.
| | |
|---|---|
| H01L 21/00 | (2006.01) |
| C09J 7/02 | (2006.01) |
| B32B 43/00 | (2006.01) |
| H01L 21/78 | (2006.01) |
| G02F 1/1333 | (2006.01) |
| H01L 51/00 | (2006.01) |
| C09J 7/40 | (2018.01) |

(52) U.S. Cl.
CPC .......... C09J 7/0225 (2013.01); B32B 43/006 (2013.01); C09J 7/40 (2018.01); G02F 1/133305 (2013.01); H01L 21/7813 (2013.01); H01L 51/003 (2013.01); H01L 51/0097 (2013.01); H01L 2251/5338 (2013.01)

(58) Field of Classification Search
CPC ................................. H05K 3/007; H05K 1/28
See application file for complete search history.

(56) References Cited

U.S. PATENT DOCUMENTS

| | | | |
|---|---|---|---|
| 9,795,035 B2 * | 10/2017 | Hatch | H05K 1/02 |
| 2012/0300419 A1 * | 11/2012 | Tang | H01L 27/1218 361/749 |
| 2016/0174358 A1 * | 6/2016 | Wu | H05K 1/028 174/254 |
| 2018/0042125 A1 * | 2/2018 | Huang | C08G 73/1071 |

FOREIGN PATENT DOCUMENTS

| | | |
|---|---|---|
| TW | I499639 B | 9/2015 |
| TW | M522850 U | 6/2016 |

* cited by examiner

*Primary Examiner* — Caridad Everhart
*Assistant Examiner* — Ankush K Singal
(74) *Attorney, Agent, or Firm* — CKC & Partners Co., LLC

(57) ABSTRACT

A method for manufacturing a flexible electrical device is provided and includes the following steps. A carrier substrate is provided. A releasing layer is formed on the carrier substrate. A flexible substrate is formed on the releasing layer. The flexible substrate has a first surface facing the releasing layer and a second surface opposite to the first surface. The flexible substrate is not in contact with the carrier substrate. A device layer is formed on the flexible substrate. The device layer has a third surface facing the flexible substrate and a fourth surface opposite to the third surface. The flexible substrate is separated from the releasing layer, and the releasing layer remains on the carrier substrate. Accordingly, the releasing layer and the carrier substrate can be recycled for forming another flexible electrical device.

19 Claims, 16 Drawing Sheets

METHOD FOR MANUFACTURING FLEXIBLE ELECTRICAL DEVICE

RELATED APPLICATIONS

This application claims priority to China Application Serial Number 201710400016.5 filed May 31, 2017, which is herein incorporated by reference.

BACKGROUND

Field of Invention

The present invention relates to a method for manufacturing a flexible display device. More particularly, the present invention relates to a manufacturing method in which a releasing layer and a carrier substrate are recyclable.

Description of Related Art

Recently, a flexible display or a flexible touch module is provided in the industry. When a flexible device is fabricated, a flexible substrate is required to be fixed on a glass carrier substrate, and electrical devices are formed on the flexible substrate, and then the flexible substrate is peeled off from the glass carrier substrate to form the flexible device. However, it may be difficult to peel off the flexible substrate from the glass carrier substrate, and the electrical devices may even be damaged due to an adhesive force between the flexible substrate and the glass carrier substrate. Therefore, it is an issue in the industry about how to improve the peeling process.

SUMMARY

A method for manufacturing a flexible electrical device is provided for allowing a releasing layer and a carrier substrate to be recyclable.

Embodiments of the present invention provide a method for manufacturing a flexible electrical device. The method includes steps of providing a carrier substrate; forming a releasing layer on the carrier substrate; forming a flexible substrate on the releasing layer, in which the flexible substrate has a first surface and a second surface opposite to the first surface, the first surface faces the releasing layer, and the flexible substrate is not in contact with the carrier substrate; forming a device layer on the flexible substrate, in which the device layer has a third surface and a fourth surface opposite to the third surface, and the third surface faces the flexible substrate; and separating the flexible substrate from the releasing layer and keeping the releasing layer remaining on the carrier substrate.

In some embodiments, a peeling force between the flexible substrate and the releasing layer is greater than or equal to 5 gf/cm and is smaller than or equal to 10 gf/cm.

In some embodiments, a peeling force between the flexible substrate and the releasing layer is smaller than a peeling force between the releasing layer and the carrier substrate.

In some embodiments, the device layer includes at least one touch electrode, at least one thin film transistor, at least one light-emitting diode, or a combination thereof.

In some embodiments, the flexible electrical device is a flexible touch panel, a flexible touch display, a flexible liquid crystal display panel, a flexible organic light emitting display panel, or a micro LED display panel.

In some embodiments, the flexible substrate includes polyimide (PI), Polyethylene Terephthalate (PET), Cyclic Olefin Polymer (COP), Polycarbonate (PC), Polymethyl Methacrylate (PMMA), Cyclic Olefin Copolymer (COC), Triacetyl Cellulose (TAC), Polypropylene (PP), Poly Styrene (PS), or glass.

In some embodiments, the carrier substrate has a first edge, a second edge, a third edge and a fourth edge. The first edge is opposite to the third edge, and the second edge is opposite to the fourth edge. The operation of forming the releasing layer on the carrier substrate includes: disposing a material of the releasing layer on the carrier substrate from the second edge to the fourth edge. The releasing layer has four edges respectively corresponding to the first to the fourth edges, and each edge of the releasing layer is spaced from the corresponding one of the first to fourth edges by a distance greater than or equal to 0.5 cm.

In some embodiments, a projection of the flexible substrate onto the carrier substrate is completely located within a projection of the releasing layer onto the carrier substrate.

In some embodiments, the releasing layer has a first edge, a second edge, a third edge and a fourth edge. The first edge is opposite to the third edge, and the second edge is opposite to the fourth edge. The process of forming the flexible substrate comprises: disposing a material of the flexible substrate on the releasing layer with from the second edge to the fourth edge. The flexible substrate is spaced from the first edge of the releasing layer by a first distance. The flexible substrate is spaced from the second edge of the releasing layer by a second distance. The flexible substrate is spaced from the third edge of the releasing layer by a third distance. The flexible substrate is spaced from the fourth edge of the releasing layer by a fourth distance. The second distance and the fourth distance are greater than the first distance and the third distance.

In some embodiments, the second distance and the fourth distance are greater than or equal to 1 cm, and the first distance and the third distance are greater than or equal to 0.5 cm.

In some embodiments, the material of the flexible substrate is disposed on the releasing layer by a slit coating process.

In some embodiments, before the flexible substrate is separated from the releasing layer, the method further includes a step of disposing a first supporting layer on the fourth surface of the device layer.

In some embodiments, an adhesive force between the first supporting layer and the device layer is greater than an adhesive force between the flexible substrate and the releasing layer.

In some embodiments, the first supporting layer is an UV film.

In some embodiments, after the flexible substrate is separated from the releasing layer, the method further includes a step of disposing a second supporting layer on the first surface of the flexible substrate.

In some embodiments, after the second supporting layer is disposed on the first surface of the flexible substrate, the method further includes steps of dividing the first supporting layer, the device layer, the flexible substrate, and the second supporting layer into regions to form flexible electrical units; and removing the first supporting layer.

In some embodiments, after the first supporting layer is removed, the method further includes: electrically connecting a flexible printed circuit board to one of the flexible electrical units.

In some embodiments, after the first supporting layer is removed, the method further includes a step of disposing a protective film, a polarizer, protective glass, or a combination thereof on the fourth surface of the device layer.

In some embodiments, the second supporting layer is a polarizer. After the first supporting layer is removed, the method further includes a step of disposing a protective film, protective glass, or a combination thereof on the fourth surface of the device layer.

In some embodiments, after the flexible substrate is separated from the releasing layer, the method further includes a step of forming another flexible substrate on the releasing layer.

Compared with the prior art, the present invention may advantageously recycling the releasing layer and the carrier substrate so as to reduce the manufacturing cost.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

The using of "first", "second", "third", etc. in the specification should be understood for identifying units or data described by the same terminology, but are not referred to particular order or sequence.

Figure 1:
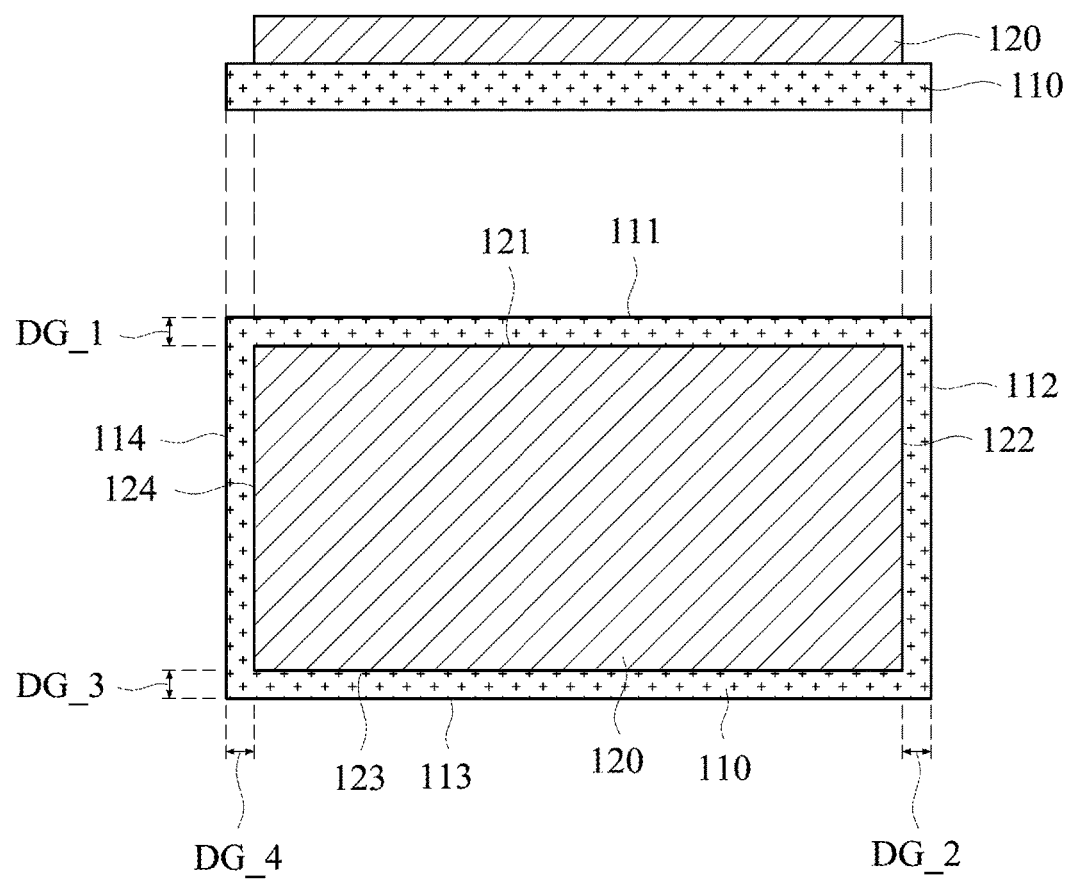
FIG. 1 to FIG. 10D are schematic cross-sectional and top views of intermediate stages illustrating a method for manufacturing a flexible electrical device in accordance with an embodiment.

FIG. 1 to FIG. 10D are schematic cross-sectional and top views of intermediate stages illustrating a method for manufacturing a flexible electrical device in accordance with an embodiment. The flexible electrical device may be a flexible touch panel, a flexible touch display panel, a flexible liquid crystal display panel, a flexible organic light emitting display panel or a flexible micro light-emitting diode (LED) display panel, which is not limited in the invention. Referring to FIG. 1, the upper part of FIG. 1 is a cross-sectional view, and the lower part of FIG. 1 is a top view. First, a carrier substrate 110 is provided, and a releasing layer 120 is formed on the carrier substrate 110. The carrier substrate 110 may be glass, ceramics, silicon, metal, or another suitable rigid substrate. The releasing layer 120 may include organic or inorganic material. For example, the releasing layer 120 may include polymer or polyimide, which is not limited in the invention. In the invention, the material of the releasing layer 120 is chosen so that an adhesive force between the releasing layer 120 and the carrier substrate 110 is greater than an adhesive force between the releasing layer 120 and a flexible substrate 210 which will be described below.

Figure 2:
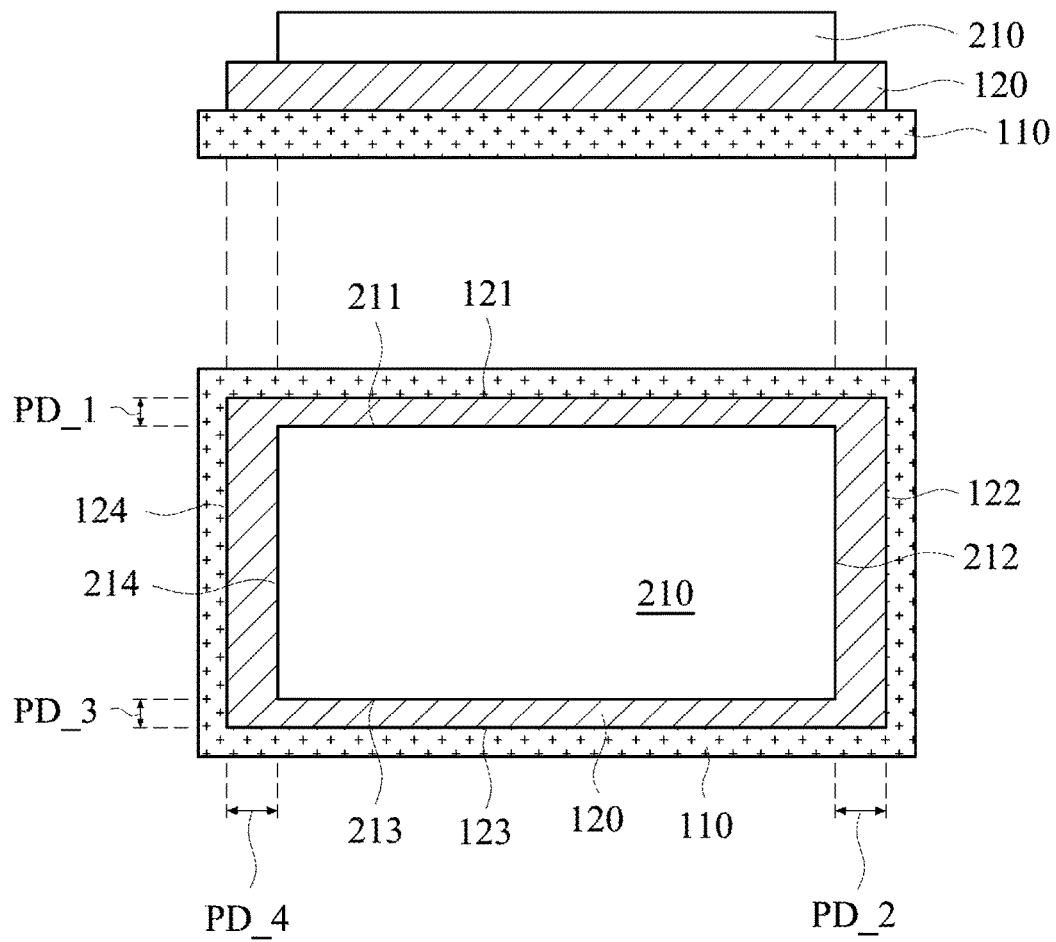

Referring to FIG. 2, the upper part of FIG. 2 is a cross-sectional view, and the lower part of FIG. 2 is a top view. Next, the flexible substrate 210 is formed on the releasing layer 120. The material of the flexible substrate 210 may include polyimide (PI), Polyethylene Terephthalate (PET), Cyclic Olefin Polymer (COP), Polycarbonate (PC), Polymethyl Methacrylate (PMMA), Cyclic Olefin Copolymer (COC), Triacetyl Cellulose (TAC), Polypropylene (PP), Poly Styrene (PS), glasses, or the combination thereof, which is not limited in the invention. In particular, a peeling force between the flexible substrate 210 and the releasing layer 120 is smaller than a peeling force between the releasing layer 120 and the carrier substrate 110. That is to say the adhesive force between the flexible substrate 210 and the releasing layer 120 is smaller than the adhesive force between the releasing layer 120 and the carrier substrate 110. Accordingly, it is capable of separating the flexible substrate 210 from the releasing layer 120 and keeping the releasing layer 120 completely remaining on the carrier substrate 110 while an appropriate peeling force is chosen. Note that if the peeling force between the flexible substrate 210 and the releasing layer 120 is too minor, then the flexible substrate 210 may be easily separated from the releasing layer 120 in subsequent processes. However, if the peeling force between the flexible substrate 210 and the releasing layer 120 is too great, it would be unfavorable for separating the flexible substrate 210 from the releasing layer 120. Therefore, in the embodiment, the peeling force between the flexible substrate 210 and the releasing layer 120 is greater than or equal to 5 gf/cm and is smaller than or equal to 10 gf/cm. On the other hand, the adhesive force between the flexible substrate 210 and the carrier substrate 110 is generally greater than the peeling force between the flexible substrate 210 and the releasing layer 120. Therefore, if a portion of the flexible substrate 210 is in direct contact with the carrier substrate 110, then in the procedure of separating the flexible substrate 210 from the releasing layer 120, the portion of the flexible substrate 210 that is in direct contact with the carrier substrate 110 needs to be cut off and then the flexible substrate 210 is able to be separated from the releasing layer 120. Consequently, the cut-off portion remains on the carrier substrate 110. In the embodiment, the flexible substrate 210 is not in contact with the carrier substrate 110, and therefore the flexible substrate 210 is capable of being separated from the releasing layer 120 by the peeling force which is greater than or equal to 5 gf/cm and is smaller than or equal to 10 gf/cm. In addition, the releasing layer 120 completely remains on the carrier substrate 110, resulting in that the releasing layer 120 could be used repeatedly to reduce cost.

In some embodiments, the carrier substrate 110 is coated with the material of the releasing layer 120 by a slit coating process and then the releasing layer 120 is coated with the material of the flexible substrate 210 by another slit coating process. However, how the releasing layer 120 and the flexible substrate 210 are formed are not limited in the invention. For example, in other embodiments, the releasing layer 120 and/or the flexible substrate 210 may be formed on the carrier substrate 110 by physical vapor deposition or chemical vapor deposition. Referring to the lower part of FIG. 1, the carrier substrate 110 has a first edge 111, a second edge 112, a third edge 113 and a fourth edge 114. The first edge 111 is opposite to the third edge 113, and the second edge 112 is opposite to the fourth edge 114. In some embodiments, the carrier substrate 110 is coated with the material of the releasing layer 120 by the slit coating process from the second edge 112 to the fourth edge 114. The releasing layer 120 has a first edge 121, a second edge 122, a third edge 123 and a fourth edge 124. The first edge 121 is opposite to the third edge 123, and the second edge 122 is opposite to the fourth edge 124. The four edges 121-124 of the releasing layer 120 are respectively spaced from the four edges 111-114 of the carrier substrate 110 by distances greater than or equal to 0.5 centimeters (cm). To be specific, a distance DG_1 between the first edge 111 and the first edge 121, a distance DG_2 between the second edge 112 and the second edge 122, a distance DG_3 between the third edge 113 and the third edge 123, and a distance DG_4 between the fourth edge 114 and the fourth edge 124 are all greater than or equal to 0.5 cm. Accordingly, the material of the releasing layer 120 is prevented from flowing toward outside of the carrier substrate 110 when the releasing layer 120 is formed on the carrier substrate 110. After the carrier substrate 110 is coated with the material of the releasing layer 120, other processes such as baking and annealing are optionally performed.

After the releasing layer 120 is formed, the releasing layer 120 is coated with the material of the flexible substrate 210. As shown in the lower part of FIG. 2, a projection of the flexible substrate 210 onto the carrier substrate 110 is completely within a projection of the releasing layer 120 onto the carrier substrate 110. The first edge 211 of the flexible substrate 210 is spaced from the first edge 121 of the releasing layer 120 by a first distance PD_1; the second edge 212 of the flexible substrate 210 is spaced from the second edge 122 of the releasing layer 120 by a second distance PD_2; the third edge 213 of the flexible substrate 210 is spaced from the third edge 121 of the releasing layer 120 by a third distance PD_3; and the fourth edge 214 of the flexible substrate 210 is spaced from the fourth edge 124 of the releasing layer 120 by a fourth distance PD_4. In some embodiments, the releasing layer 120 is coated with the material of the flexible substrate 210 by the slit coating process from the second edge 122 to the fourth edge 124. In particular, the second distance PD_2 and the fourth distance PD_4 are greater than the first distance PD_1 and the third distance PD_3 in order to prevent the material of the flexible substrate 210 from flowing toward outside of the releasing layer 120 and being in contact with the carrier substrate 110 when forming the flexible substrate 210 on the releasing layer 120. If the flexible substrate 210 is in contact with the carrier substrate 110, the flexible substrate may not be easily separated from the carrier substrate 110 because the adhesive force between the flexible substrate 210 and the carrier substrate 110 is greater than the adhesive force between the flexible substrate 210 and the releasing layer 120. For example, the second distance PD_2 and the fourth distance PD_4 are greater than or equal to 1 cm, and the first distance PD_1 and the third distance PD_3 are greater than or equal to 0.5 cm. After the releasing layer 120 is coated with the material of the flexible substrate 210, other processes such as baking and annealing may be performed.

In some embodiment, the second distance PD_2 is equal to the fourth distance PD_4, and the first distance PD_1 is equal to the third distance PD_3, which is not limited in the invention. In some embodiments, the releasing layer 120 is coated with the material of flexible substrate 210 by the slit coating process from the first edge 121 to the third edge 123. In this case, the first distance PD_1 and the third distance PD_3 are greater than the second distance PD_2 and the fourth distance PD_4, the first distance PD_1 and the third distance PD_3 are greater than or equal to 1 cm, and the second distance PD_2 and the fourth distance PD_4 are greater than or equal to 0.5 cm.

Figure 3A:
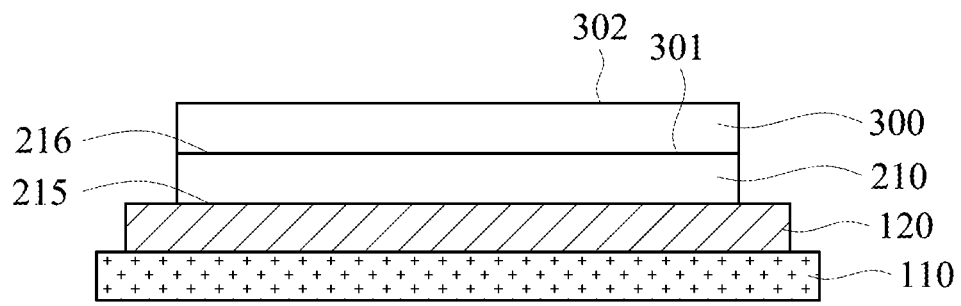
Figure 3B:
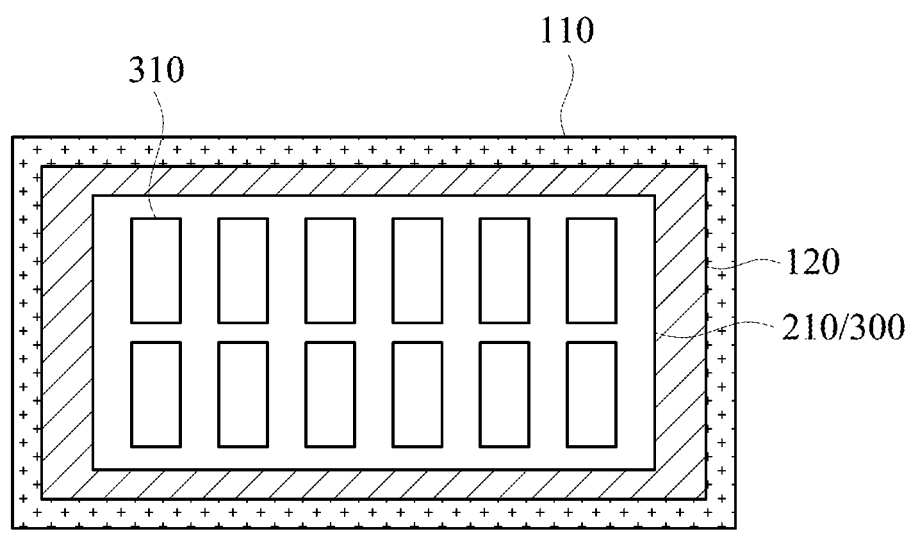
Figure 3C:
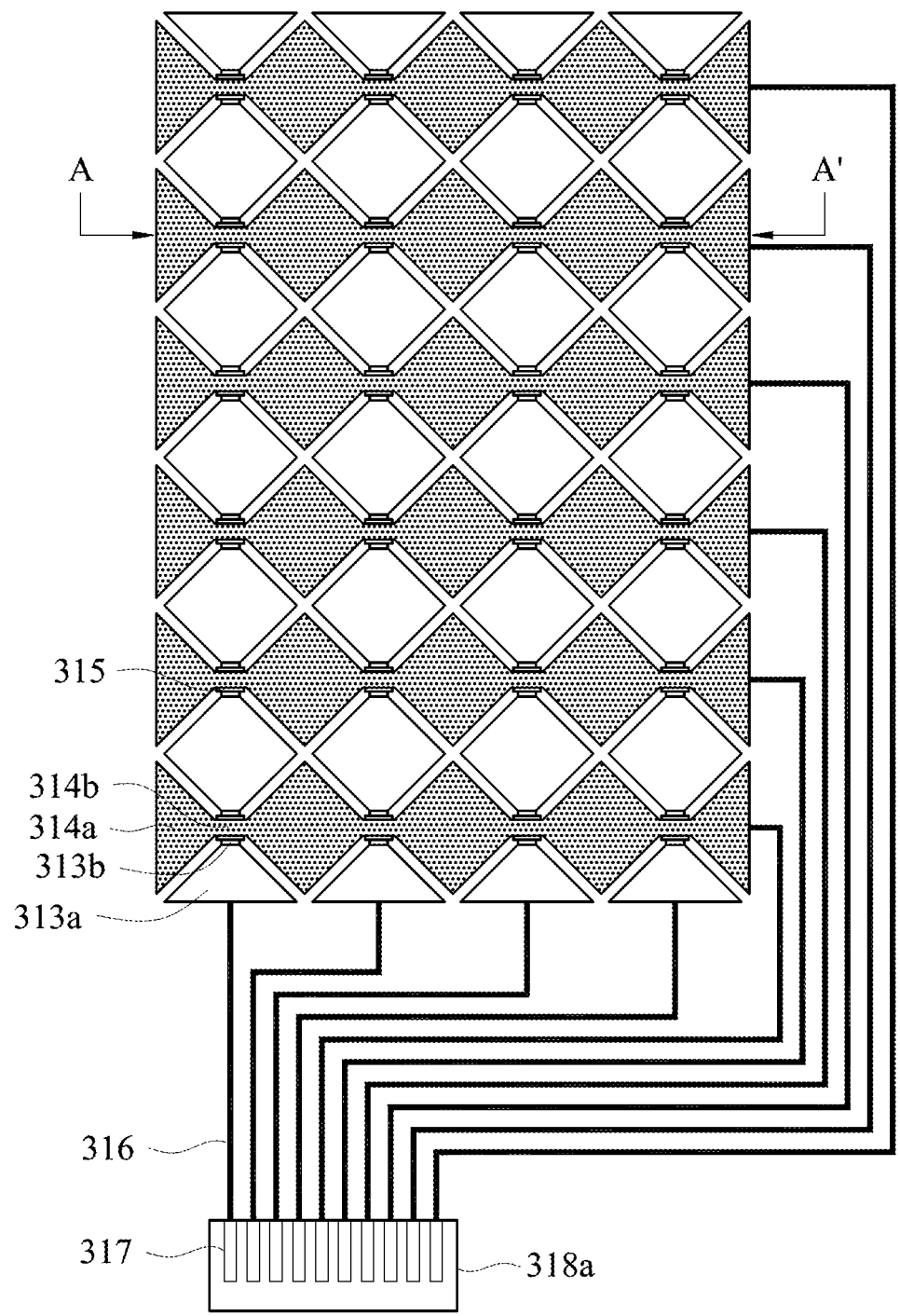
Figure 3D:
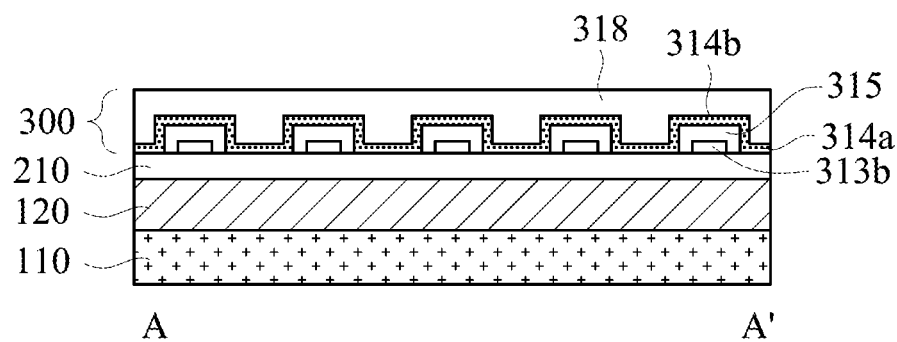

Next, referring to FIG. 3A, the flexible substrate 210 has a first surface 215 and a second surface 216 opposite to the first surface 215. The first surface 215 faces the releasing layer 120 and is in contact with the releasing layer 120. As shown in FIG. 3A, a device layer 300 is formed on the second surface 216 of the flexible substrate 210. The device layer 300 has a third surface 301 and a fourth surface 302 opposite to the third surface 301. The third surface 301 faces the flexible substrate 210 and in contact with the flexible substrate 210. In a varied embodiment, the third surface 301 faces the flexible substrate 210, and at least one insulation layer is disposed between the device layer 300 and the flexible substrate 210 as a buffer layer and/or an index matching layer. The device layer 300 may have a single layer structure or a multi-layer structure, and the device layer 300 may include, but is not limited to, at least one touch electrode (e.g. single layer touch electrode or multi-layer touch electrodes), at least one thin film transistor, at least one light-emitting diode (e.g. organic light-emitting diode or inorganic light-emitting diode), or any combination thereof. For example, if the flexible electrical device to be formed is a flexible touch panel, then the device layer 300 may include the touch electrode; if the flexible electrical device to be formed is a flexible touch display panel, then the device layer 300 may include the touch electrode, the thin film transistor and a pixel electrode, or include the touch electrode, the thin film transistor and the organic light-emitting diode; if the flexible electrical device to be formed is a flexible liquid crystal display, then the device layer 300 may include the thin film transistor and the pixel electrode; if the flexible electrical device to be formed is a flexible organic display panel, then the device layer 300 may include the thin film transistor and the organic light-emitting diode. However, the invention is not limited thereto, the components in the device layer 300 are not limited in the invention. Referring to FIG. 3B, FIG. 3B is a top view. The device layer 300, the flexible substrate 210, the releasing layer 120 and the carrier substrate 110 are stacked with each other. The device layer 300 includes multiple device units 310. In this embodiment, the pattern and the structure of each device unit 310 are identical to each other, which is not limited in the invention. For example, if the flexible electrical device to be formed is the flexible touch module, then the cross-sectional view and the top view of one device unit 310 are respectively shown as FIG. 3C and FIG. 3D, in which FIG. 3D is the cross-sectional view along a cross-sectional line AA' of FIG. 3C. The device unit 310 includes multiple first touch electrodes 313a and second touch electrodes 314a. Adjacent first touch electrodes 313a are electrically connected to each other through a first bridging line 313b. Adjacent second touch electrodes 314a are connected to each other through a second bridging line 314b. The first bridging line 313b is electrically insulated from the second bridging line 314b by an insulation block 315 disposed therebetween. The first touch electrodes 313a and the first bridging lines 313b form multiple touch electrode columns, and the second touch electrodes 314a and the second bridging lines 314b form multiple touch electrode rows. The touch electrode rows and the touch electrode columns are electrically connected to pads 317 through conductive lines 316. An insulation layer 318 covers the touch electrode rows, the touch electrode columns and the conductive lines 316, and has an opening 318a to expose the pads 317 which are configured to be electrically connected to a flexible printed circuit board for transmitting/receiving touch sensing signals. The pattern and the structure of the touch sensing unit are not limited to FIG. 3C and FIG. 3D in the invention.

Figure 4:
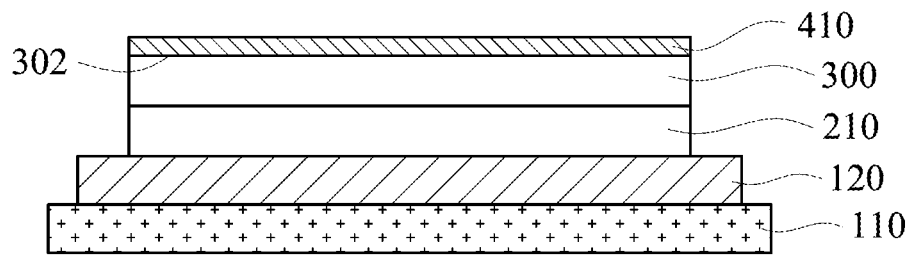

Referring to FIG. 4, a first supporting layer 410 is disposed above the device layer 300, and that is to say the first supporting layer 410 is disposed on the fourth surface 302 of the device layer 300. The first supporting layer 410 is used to protect the flexible substrate from being broken in the subsequent peeling process, and to support the flexible substrate 210 and the device layer 300 after the flexible substrate 210 is separated from the releasing layer 120. In some embodiments, the first supporting layer 410 is an UV film, Polyethylene Terephthalate (PET), a protective film or other flexible films with hard characteristics. In particular, the adhesive force between the first supporting layer 410 and the device layer 300 is greater than the adhesive force between the flexible substrate 210 and the releasing layer 120 so as to successfully separate the flexible substrate 210 from the releasing layer 120 and to keep the first supporting layer 410 remaining on the device layer 300.

Figure 5:
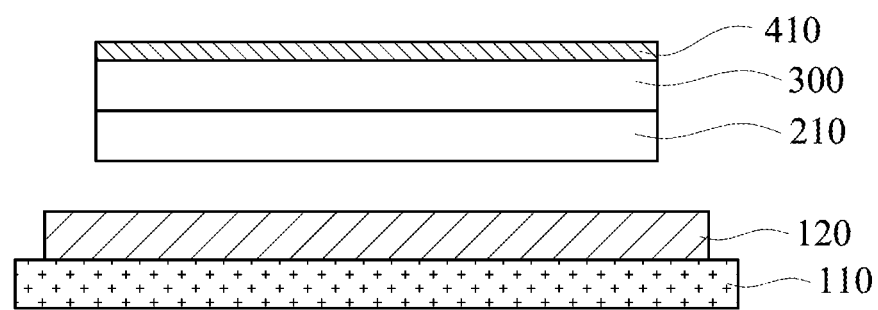

Referring to FIG. 5, the flexible substrate 210 is separated from the releasing layer 120 by a peeling force greater than or equal to 5 gf/cm and smaller than or equal to 10 gf/cm, and the releasing layer 120 remains on the carrier substrate 110. In the invention, any mechanical approach may be adopted to separate the flexible substrate 210 from the releasing layer 120, which is not limited in the invention. For example, one end of the flexible substrate 210 may be fixed by a clamp, and the flexible substrate 210, the device layer 300 and the first supporting layer 410 are separated from the carrier substrate 110 and the releasing layer 120 by an appropriate speed and angle, which is not limited in the invention. Note that the releasing layer 120 remains on the carrier substrate 110 completely after the flexible substrate 210 is separated from the releasing layer 120. Accordingly, the releasing layer 120 and the carrier substrate 110 may be recycled and used repeatedly.

Figure 6:
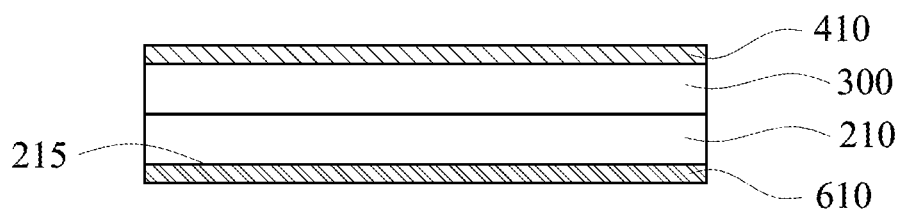

Next, Referring to FIG. 6, a second supporting layer 610 is disposed beneath the flexible substrate 210, and that is to say the second supporting layer 610 is disposed on the first surface 215 of the flexible substrate 210. The second supporting layer 610 may be a polarizer or other supporting layer without polarizing function to protect the first surface 215 of the flexible substrate 210 from being scratched or damaged. For example, the supporting layer 610 without polarizing function may be PET or other flexible protective films.

Next, an electrical test procedure is performed on the device layer 300 to test if the components and/or processes of the device layer 300 are normal. The specific content of the electrical test procedure is not limited in the invention. For example, in some embodiments of the electrical test procedure, a probe is used to test the pads of the device units 310 and/or to test a test-key located on the street line region between the adjacent device units 310 or between the device unit 310 and the edge of the device layer 300 to determine if the device units 310 and/or the processes are normal, which is not limited in the invention. In this embodiment, the test-key is configured to determine if the processes are normal, which is not limited in the invention. For example, in some embodiments, the test-key has several test patterns for testing short circuit, open circuit, resistance of the transparent conductive layer, or the combination thereof so as to determine if the processes are normal, but the invention is not limited thereto.

In some embodiments, a multi-layer structure including the second supporting layer 610, the flexible substrate 210, the device layer 300 and the first supporting layer 410 is shipped to the customer after the electrical test procedure is performed. On the other hand, in other embodiments, after the step of FIG. 6 is performed, the first supporting layer 410 is removed, the electrical test procedure is performed, a protective film is disposed on the fourth surface 302 of the device layer 300, and then it is shipped to the customer. In yet other embodiments, the multi-layer structure is shipped to the customer before the electrical test procedure is performed, and the customer would do the electrical test procedure. The shipping approach mentioned above is also referred to as panel shipping. In other embodiments, the following processes are performed before shipping to the customer.

Figure 7:
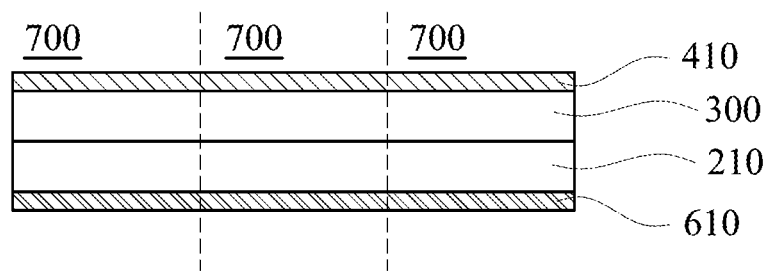

Next, referring to FIG. 7, the first supporting layer 410, the device layer 300, the flexible substrate 210 and the second supporting layer 610 are divided into multiple regions to form flexible electrical units 700. Each flexible electrical unit 700 includes one or more device units 310. In some embodiments, punch, wheel cutting, or laser cutting may be adopted for the dividing procedure, but the invention is not limited thereto. In addition, the number of the regions is not limited in the invention. Each flexible electrical unit 700 can be used to form one flexible electrical device. In the following description, for purpose of simplification, only one flexible electrical unit 700 is described.

Figure 8:
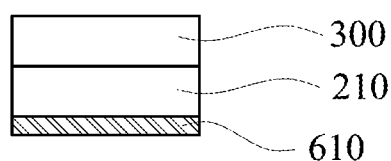
Figure 9A:
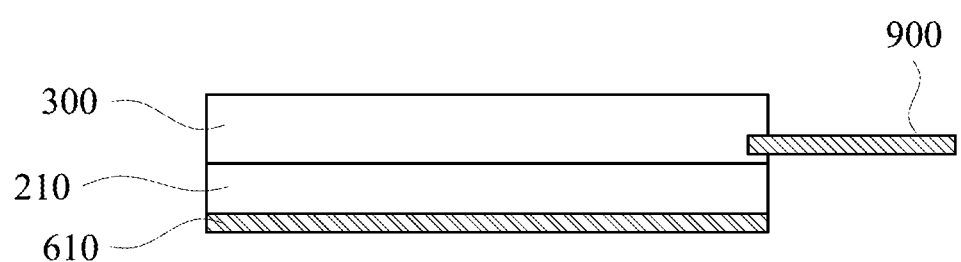
Figure 9B:
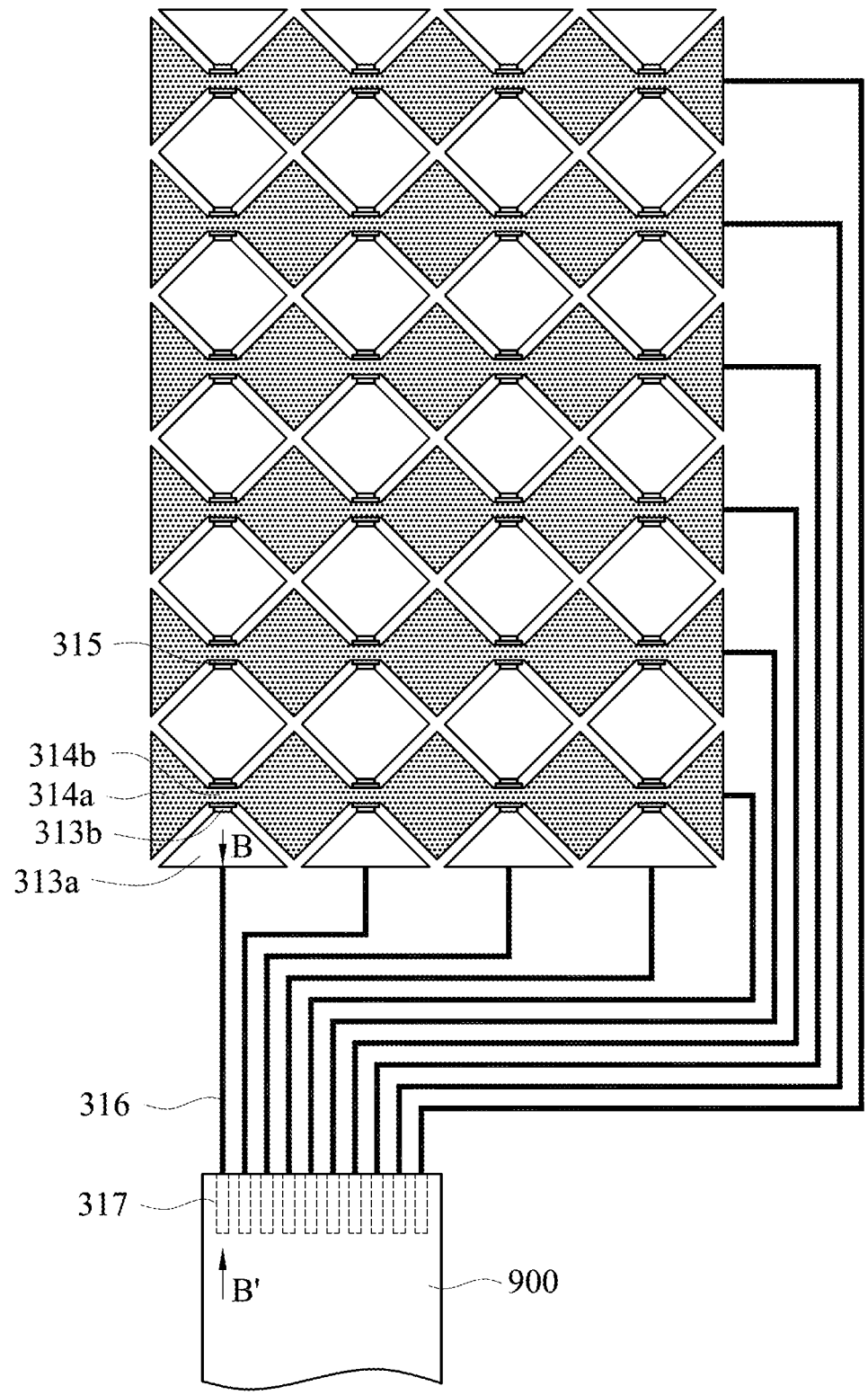
Figure 9C:
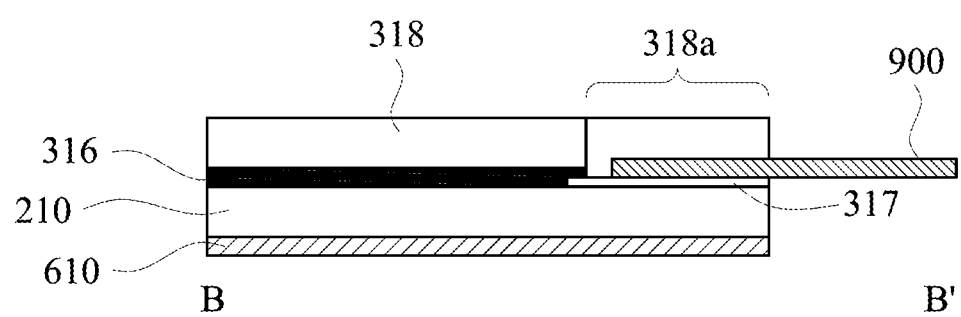

Next, referring to FIG. 8, the first supporting layer 410 is removed. For example, when the first supporting layer 410 is an UV film, the flexible electrical units 700 may be irradiated by UV light to reduce the adhesion between the UV film and the device layer 300, so as to remove the first supporting layer 410. Next, referring to FIG. 9A, a flexible printed circuit board 900 is electrically connected to the flexible electrical units 700. Referring to FIG. 9B and FIG. 9C, FIG. 9C is a cross-sectional view along a cross-sectional line BB' of FIG. 9B. For example, if the flexible electrical device is a flexible touch module and the top view of the device unit 310 is shown in FIG. 3C, then the flexible printed circuit board 900 is electrically connected to the pads 317. Note that the electrical testing step for the flexible electrical units 700 may be performed between the step of FIG. 8 and the step of FIG. 9A, or performed after the step of FIG. 9A in some embodiments.

Figure 10A:
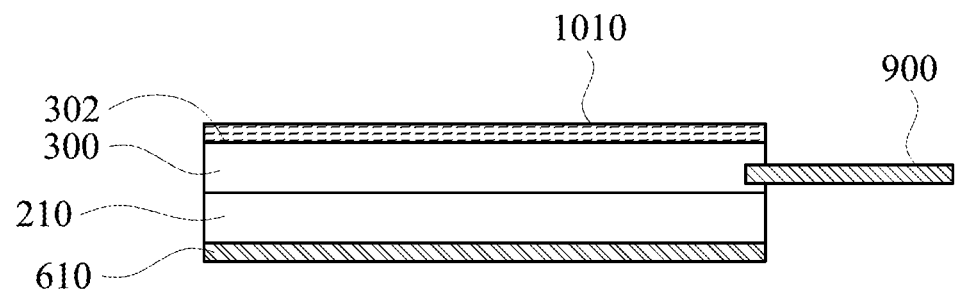
Figure 10B:
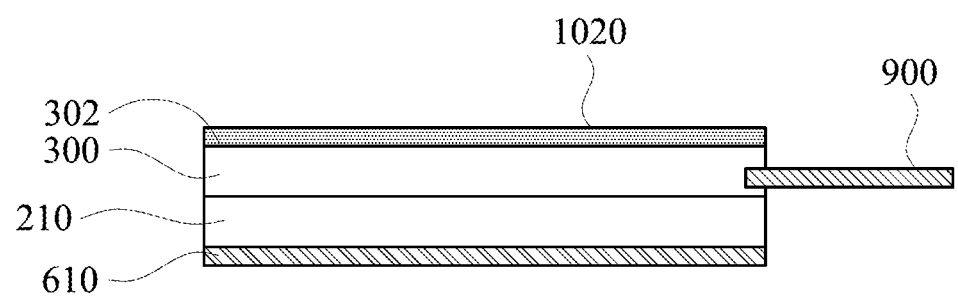
Figure 10C:
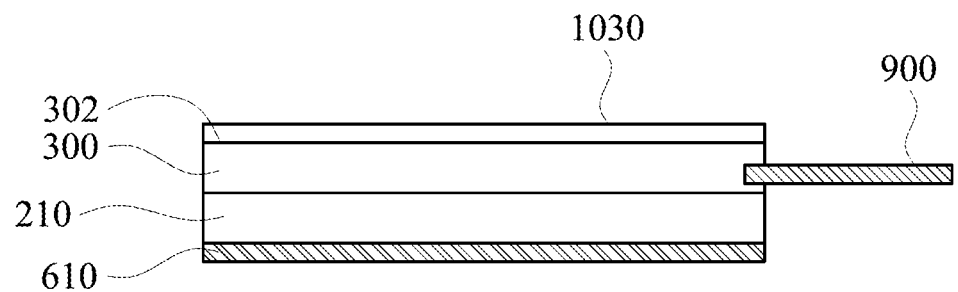
Figure 10D:
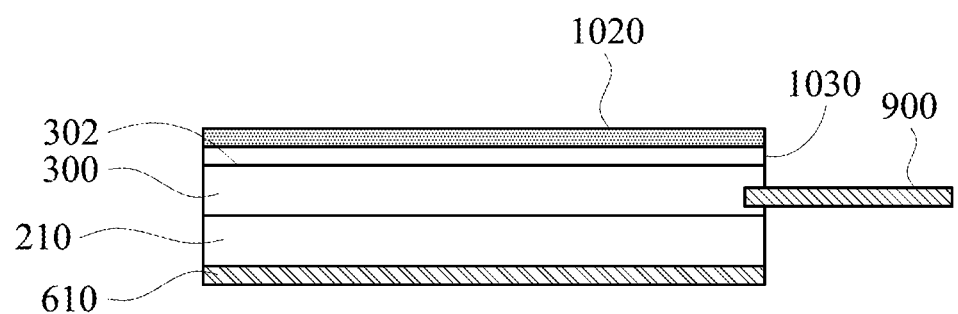

Next, a protective film, a polarizer, a protective glass or the combination thereof may be disposed on the fourth surface 302 of the device layer 300 before shipping to the customer. Compared to the aforementioned panel shipping, this shipping is also referred to as a chip shipping. Several embodiments will be described blow with respect to variety of the second supporting layer 610. Referring to FIG. 10A and FIG. 10B, in a first varied embodiment, the second supporting layer 610 is a polarizer, and therefore a protective film 1010 (as shown in FIG. 10A) or protective glass 1020 (as shown in FIG. 10B) may be disposed on the fourth surface 302 of the device layer 300. Referring to FIG. 10A, FIG. 10C and FIG. 10D, in a second varied embodiment, the second supporting layer 610 is a supporting layer except for the polarizer, and therefore a protective film 1010 (as shown in FIG. 10A) or a polarizer 1030 (as shown in FIG. 10C) may be disposed on the fourth surface 302 of the device layer 300. Alternatively, a polarizer 1030 and protective glass 1020 (as shown in FIG. 10D) may be disposed on the fourth surface 302 of the device layer 300. In addition, in the present embodiment, the product is shipped to the customer after the protective film, the polarizer, the protective glass, or the combination thereof is bonded to the device layer 300, but the invention is not limited thereto. In another embodiment, the product may be shipped to the customer after the step of FIG. 7, FIG. 8 or FIG. 9A is performed.

Referring to FIG. 5, after the flexible substrate 210 is separated from the releasing layer 120, the releasing layer 120 and the carrier substrate 110 may be optionally cleaned, recycled, and stored before another flexible substrate is formed on the releasing layer 120 remaining on the carrier substrate 110. In some embodiment, the step of cleaning the releasing layer 120 and the carrier substrate 110 is performed by water or plasma, which is not limited in the invention. Besides, the releasing layer 120 and the carrier substrate 110 may be stored in any form of warehouse. When needed, the releasing layer 120 and the carrier substrate 110 can be retrieved from the warehouse, and then another flexible substrate is formed on the releasing layer 120. As a result, the releasing layer 120 and the carrier substrate 110 can be used repeatedly. Compared with the prior art in which the remains of the releasing layer 120 on the carrier substrate 110 are required to be removed after the peeling process step and another releasing layer 120 is disposed on the carrier substrate 110 before another flexible substrate is formed, the present embodiment has at least one advantage of less material consumption.

Figure 11A:
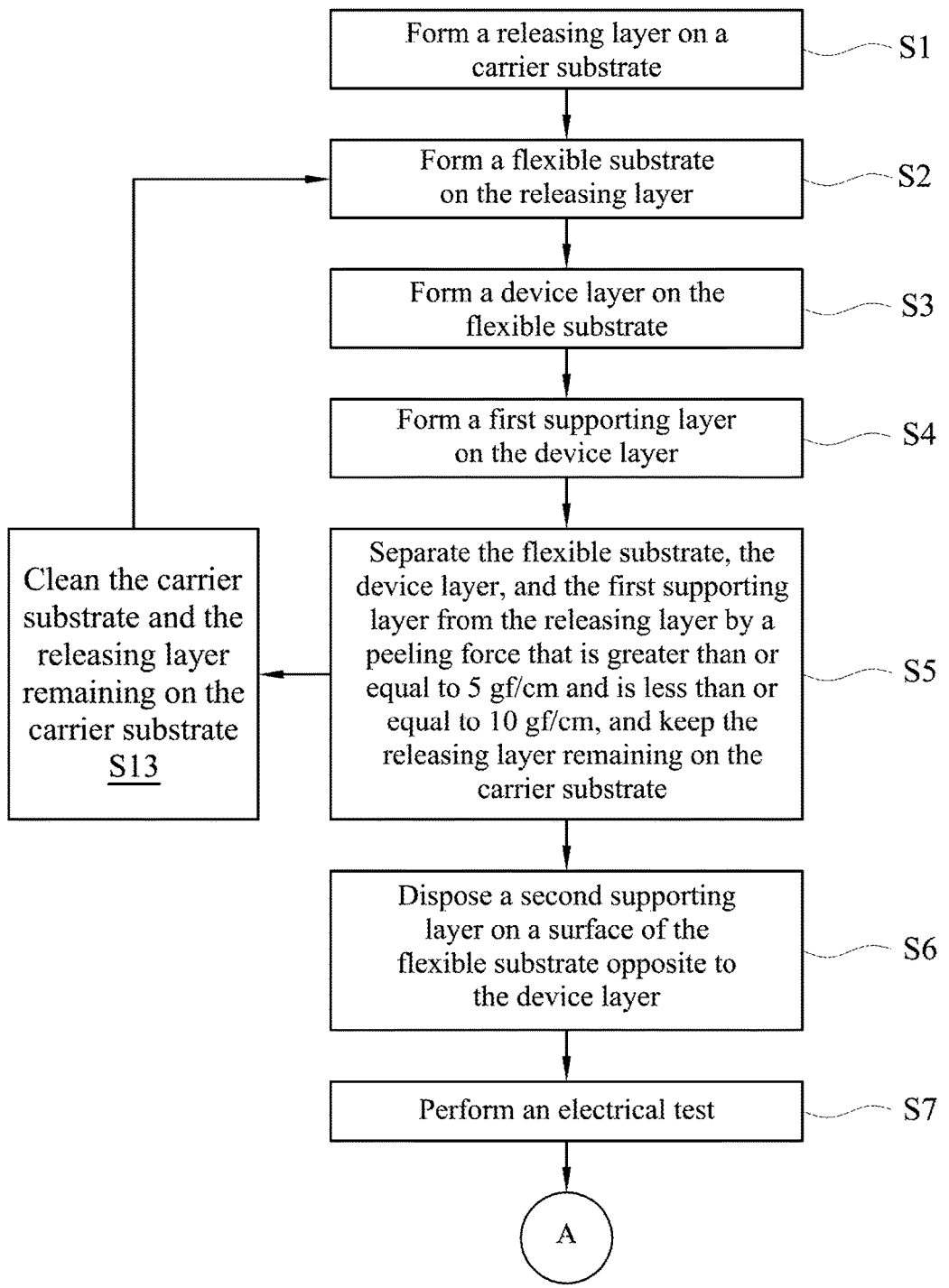
FIG. 11A and FIG. 11B are flow charts of the method for manufacturing the flexible electrical device in the invention.
Figure 11B:
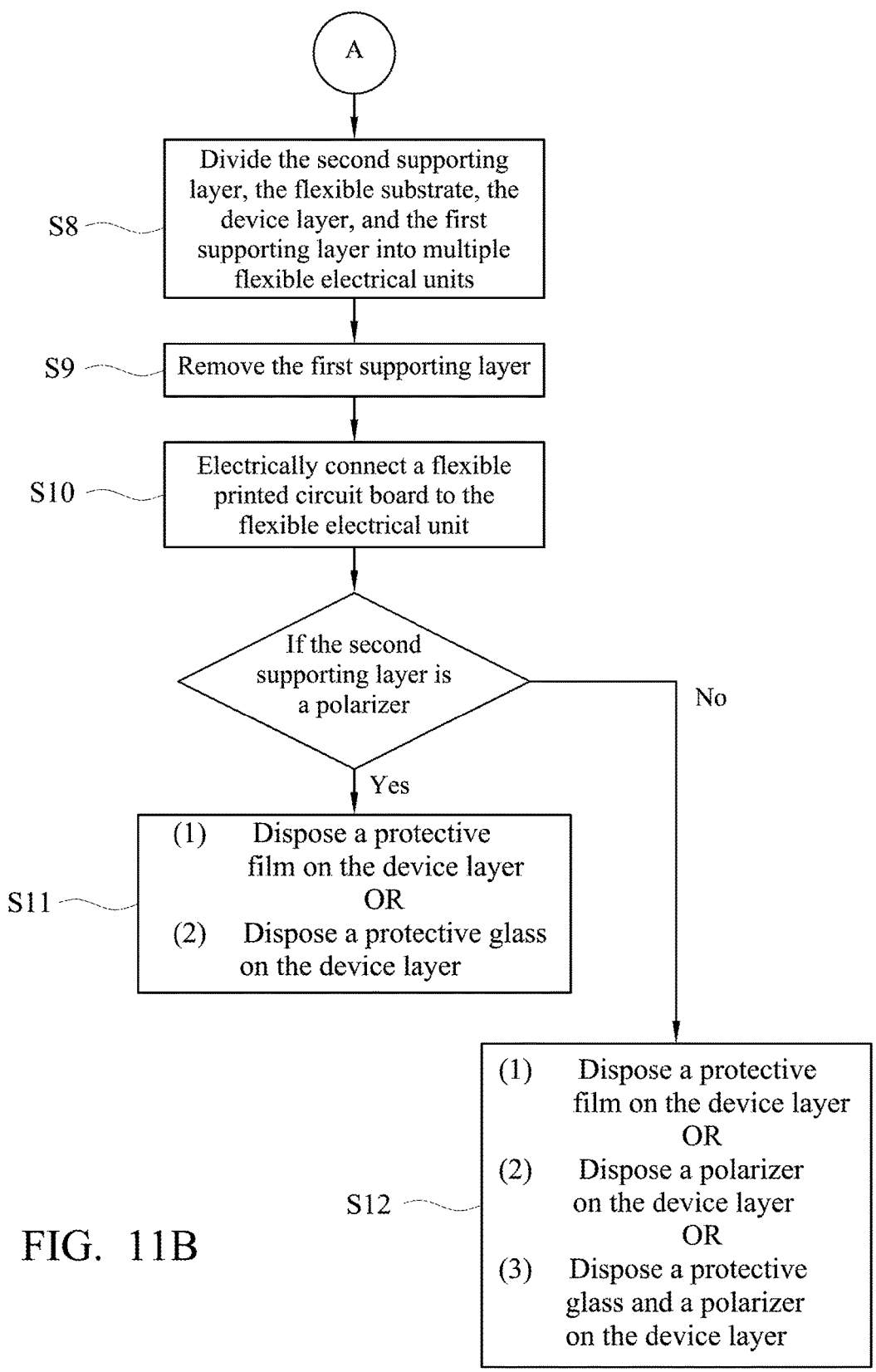

Referring to FIG. 11A and FIG. 11B, FIG. 11A and FIG. 11B are flow charts of the method for manufacturing the flexible electrical device in the invention. The method for manufacturing the flexible electrical device includes the following steps. In steps S1 to S4, a releasing layer, a flexible substrate, a device layer and a first supporting layer are sequentially formed on the carrier substrate. In step S5, the flexible substrate, the device layer, and the first supporting layer are separated from the releasing layer by a peeling force that is greater than or equal to 5 gf/cm and is smaller than or equal to 10 gf/cm, and the releasing layer remains on the carrier substrate. In step S6 and S7, a second supporting layer is disposed on a surface of the flexible substrate opposite to the device layer, and an electrical test is performed on the device unit. In step S8 to S10, the second supporting layer, the flexible substrate, the device layer, and the first supporting layer are divided into multiple flexible electrical units, and the first supporting layer is removed, and the flexible printed circuit board is electrically connected to the flexible electrical unit. When the second supporting layer is a polarizer, step S11 is performed; and when the second supporting layer is not the polarizer, step S12 is performed. In step S11, a protective film or a protective glass is disposed on the device layer. In step S12, a protective film, a polarizer, or the combination of the polarizer and protective glass is disposed on the device layer. In the invention, step S13 is performed after the step S5. In the step S13, the carrier substrate and the releasing layer remaining on the carrier substrate are cleaned. Then, the step S2 is performed on the carrier substrate and the releasing layer remaining on the carrier substrate obtained from the step S13, and that is to say the flexible substrate is formed on the releasing layer. Therefore, the releasing layer is re-used for reducing the cost. Note that in the embodiment of FIG. 11A and FIG. 11B, the step S13, in which the carrier substrate and the releasing layer remaining on the carrier substrate are cleaned, is performed before another flexible substrate is formed on the releasing layer remaining on the carrier substrate, but the invention is not limited thereto. In a varied embodiment, the step S13 is skipped, and the step S2 is performed on the carrier substrate and the releasing layer remaining on the carrier substrate after step S5.

Note that the order of the aforementioned steps may be modified in the invention, and other steps may be inserted between the steps. For example, in a varied embodiment, the electrical test for the flexible electrical units 700 may be performed between the step S9 and the step S10, or performed between the step S10 and the step S11 (or step S12). In addition, in the embodiment of panel shipping, the multi-layer structure including the second supporting layer, the flexible substrate, the device layer and the first supporting layer may be shipped to the customer after the step S6 or S7 is performed, and the remaining steps may be performed by the customer, but not limited thereto. In the embodiment of chip shipping, the product may be shipped to the customer after the step S8, S9, S10, S11 or S12 is performed, and the remaining steps may be performed by the customer, but not limited thereto.

Figure 12:
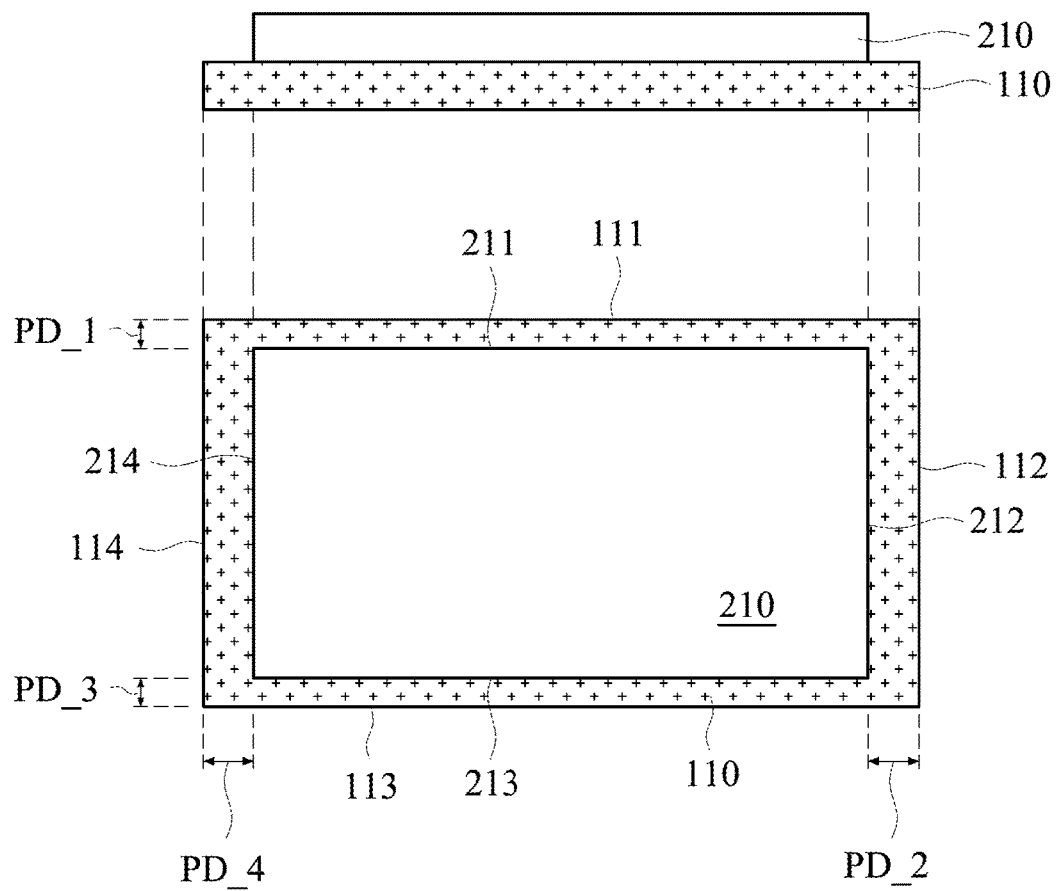
FIG. 12 to FIG. 15 are schematic cross-sectional and top views of intermediate stages illustrating a method for manufacturing a flexible electrical device in accordance with another embodiment.

In some embodiments, the releasing layer may be omitted, and the flexible substrate is directly disposed on the carrier substrate. For example, FIG. 12 to FIG. 15 are schematic cross-sectional and top views of intermediate stages illustrating a method for manufacturing a flexible electrical device in accordance with another embodiment. Referring to FIG. 12, the upper part of FIG. 12 is a cross-sectional view, and the lower part is a top view. First, a carrier substrate 110 is provided, and a flexible substrate 210 is disposed on the carrier substrate 110. The flexible substrate 210 is in direct contact with the carrier substrate 110. In particular, the peeling force between the flexible substrate 210 and the carrier substrate 110 is greater than or equal to 5 gf/cm and is smaller than or equal to 10 gf/cm. The first edge 211 of the flexible substrate 210 is spaced from the first edge 111 of the carrier substrate 110 by a first distance PD_1; the second edge 212 is spaced from the second edge 112 by a second distance PD_2; the third edge 213 is spaced from the third edge 113 by a third distance PD_3; the fourth edge 214 is spaced from the fourth edge 114 by a fourth distance PD_4. In the embodiment, the carrier substrate 110 is coated with the flexible substrate 210 by a slit coating process from the second edge 112 to the fourth edge 114. For example, the flexible substrate 210 is formed on the carrier substrate 110 by the slit coating process, but the invention is not limited thereto. How the flexible substrate 210 is formed is not limited in the invention. In particular, the second distance PD_2 and the fourth distance PD_4 are greater than the first distance PD_1 and the third distance PD_3 to prevent the flexible substrate 210 from flowing toward outside of the carrier substrate 110 when forming the flexible substrate 210 on the carrier substrate 110. For example, the second distance PD_2 and the fourth distance PD_4 are greater than or equal to 1 cm, and the first distance PD_1 and the third distance PD_3 are greater than or equal to 0.5 cm.

Figure 13:
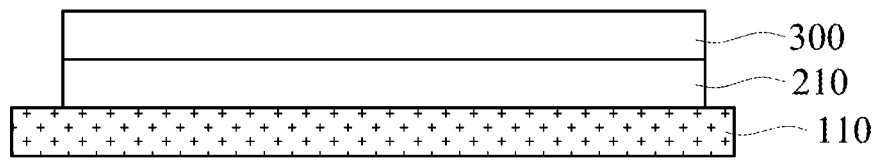
Figure 14:
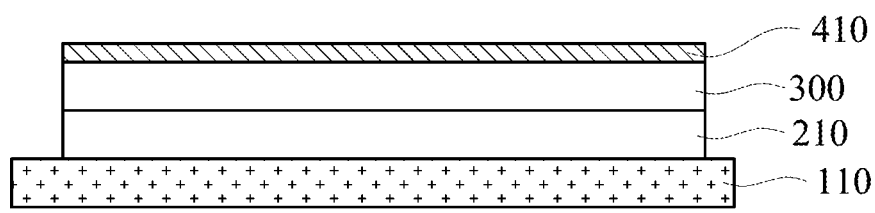
Figure 15:
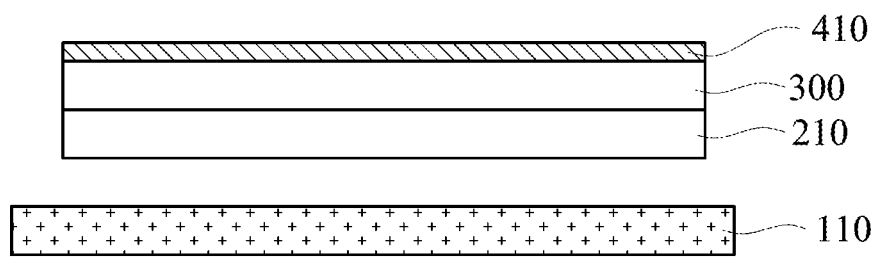

Referring to FIG. 13, the device layer 300 is formed on the flexible substrate 210. The device layer 300 may include a touch electrode, a thin film transistor, an organic light-emitting diode, or the combination thereof, which is not limited in the invention. Next, referring to FIG. 14, the first supporting layer 410 is disposed on the device layer 300. The first supporting layer 410 is used to support the flexible substrate 210 and the device layer 300 after the flexible substrate 210 is separated from the carrier substrate 110. Referring to FIG. 15, the flexible substrate 210 is separated from the carrier substrate 110. Note that the peeling force between the flexible substrate 210 and the carrier substrate 110 is greater than or equal to 5 gf/cm, and therefore the flexible substrate 210 may not be easily separated from the carrier substrate 110 when forming the device unit 310. On the other hand, the peeling force between the flexible substrate 210 and the carrier substrate 110 is smaller than or equal to 10 gf/cm, and therefore the flexible substrate 210 will not be damaged due to an excessive force when separating the flexible substrate 210 from the carrier substrate 110. After the step of FIG. 15 is performed, the subsequent steps are similar to that of FIG. 6 to FIG. 10D, and therefore the description will not be repeated.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a plurality of flexible electrical devices, the method comprising:
   providing a carrier substrate;
   forming a releasing layer on the carrier substrate;
   forming a flexible substrate on the releasing layer, wherein the flexible substrate has a first surface and a second surface opposite to the first surface, the first surface faces the releasing layer, and the flexible substrate is not in contact with the carrier substrate;
   forming a device layer on the flexible substrate, wherein the device layer has a third surface and a fourth surface opposite to the third surface, and the third surface faces the flexible substrate;
   separating the flexible substrate from the releasing layer and keeping the releasing layer remaining on the carrier substrate; and
   forming another flexible substrate on the releasing layer after the flexible substrate is separated from the releasing layer.

2. The method of claim 1, wherein a peeling force between the flexible substrate and the releasing layer is greater than or equal to 5 gf/cm and is smaller than or equal to 10 gf/cm.

3. The method of claim 1, wherein a peeling force between the flexible substrate and the releasing layer is smaller than a peeling force between the releasing layer and the carrier substrate.

4. The method of claim 1, wherein the device layer comprises at least one touch electrode, at least one thin film transistor, at least one light-emitting diode, or a combination thereof.

5. The method of claim 4, wherein the flexible electrical devices are flexible touch panels, flexible touch displays flexible liquid crystal display panels, flexible organic light emitting display panels, or micro light-emitting diode (LED) display panels.

6. The method of claim 1, wherein the flexible substrate comprises polyimide (PI), Polyethylene Terephthalate (PET), Cyclic Olefin Polymer (COP), Polycarbonate (PC), Polymethyl Methacrylate (PMMA), Cyclic Olefin Copolymer (COC), Triacetyl Cellulose (TAC), Polypropylene (PP), Poly Styrene (PS), or glass.

7. The method of claim 1, wherein the carrier substrate has a first edge, a second edge, a third edge and a fourth edge, wherein the first edge is opposite to the third edge, the second edge is opposite to the fourth edge, and forming the releasing layer on the carrier substrate comprises:
   disposing a material of the releasing layer on the carrier substrate from the second edge to the fourth edge, wherein the releasing layer has four edges respectively corresponding to the first to the fourth edges, and each of the four edges of the releasing layer is spaced from the corresponding one of the first to fourth edges by a distance greater than or equal to 0.5 cm.

8. The method of claim 1, wherein a projection of the flexible substrate onto the carrier substrate is completely located within a projection of the releasing layer onto the carrier substrate.

9. The method of claim 8, wherein the releasing layer has a first edge, a second edge, a third edge and a fourth edge, wherein the first edge is opposite to the third edge, the second edge is opposite to the fourth edge, and forming the flexible substrate comprises:
   disposing a material of the flexible substrate on the releasing layer from the second edge to the fourth edge, wherein the flexible substrate is spaced from the first edge of the releasing layer by a first distance, the flexible substrate is spaced from the second edge of the releasing layer by a second distance, the flexible substrate is spaced from the third edge of the releasing layer by a third distance, the flexible substrate is spaced from the fourth edge of the releasing layer by a fourth distance, and the second distance and the fourth distance are greater than the first distance and the third distance.

10. The method of claim 9, wherein the second distance and the fourth distance are greater than or equal to 1 cm, and the first distance and the third distance are greater than or equal to 0.5 cm.

11. The method of claim 9, wherein the material of the flexible substrate is disposed on the releasing layer by a slit coating process.

12. The method of claim 1, wherein before the flexible substrate is separated from the releasing layer, the method further comprises:
   disposing a first supporting layer on the fourth surface of the device layer.

13. The method of claim 12, wherein an adhesive force between the first supporting layer and the device layer is greater than an adhesive force between the flexible substrate and the releasing layer.

14. The method of claim 12, wherein the first supporting layer is an UV film.

15. The method of claim 12, wherein after the flexible substrate is separated from the releasing layer, the method further comprises:
   disposing a second supporting layer on the first surface of the flexible substrate.

16. The method of claim 15, wherein after the second supporting layer is disposed on the first surface of the flexible substrate, the method further comprises:
   dividing the first supporting layer, the device layer, the flexible substrate, and the second supporting layer into a plurality of regions to form a plurality of flexible electrical units; and
   removing the first supporting layer.

17. The method of claim 16, wherein after the first supporting layer is removed, the method further comprises:
   electrically connecting a flexible printed circuit board to one of the flexible electrical units.

18. The method of claim 16, wherein after the first supporting layer is removed, the method further comprises:

disposing a protective film, a polarizer, a protective glass, or a combination thereof on the fourth surface of the device layer.

19. The method of claim 16, wherein the second supporting layer is a polarizer, and after the first supporting layer is removed, the method further comprises:
   disposing a protective film, protective glass, or a combination thereof on the fourth surface of the device layer.

* * * * *